United States Patent [19]

Guterman et al.

[11] 4,302,766
[45] Nov. 24, 1981

[54] SELF-LIMITING ERASABLE MEMORY CELL WITH TRIPLE LEVEL POLYSILICON

[75] Inventors: Daniel C. Guterman; Te-Long Chiu, both of Houston, Tex.

[73] Assignee: Texas Instruments Incorporated, Dallas, Tex.

[21] Appl. No.: 1,097

[22] Filed: Jan. 5, 1979

[51] Int. Cl.³ .................... H01L 27/02; B01J 17/00
[52] U.S. Cl. ................................. 357/41; 357/23; 357/45; 357/51; 357/59; 29/576 R; 29/577 C; 29/578
[58] Field of Search .................. 357/23, 41, 45, 51, 357/59; 29/576

[56] References Cited

U.S. PATENT DOCUMENTS

| 3,744,036 | 7/1973 | Frohman-Bentchrowsky | 357/41 |
| 4,099,196 | 7/1978 | Simko | 357/23 |

Primary Examiner—Edward J. Wojciechowicz
Attorney, Agent, or Firm—John G. Graham

[57] ABSTRACT

A non-volatile semiconductor memory device of the electrically erasable type employs a floating gate which is programmed by application to high voltage across the source and drain so that hot electrons traverse the gate oxide. The floating gate is discharged by electron tunneling through an erase window which is separated from the control gate. Very small cell size is provided by a triple level polysilicon structure.

15 Claims, 18 Drawing Figures

| OPERATION | VOLTAGE, WITH RESPECT TO SUBSTRATE, ON: | | | | |
|---|---|---|---|---|---|
| | ADDRESS LINE 18 | ADDRESS LINE 28 | ERASE LINE 21 | COMMON SOURCE 11 | COMMON DRAIN, Y ADDRESS 13 |
| READ | 5 | 5 | 0 | 0 | 5 |
| WRITE | 25 | 25 | 0 | 20 | 0 |
| $\overline{WRITE}$ | 0 | 0 | 0 | 20 | 0 |
| $\overline{WRITE}$ | 25 | 25 | 0 | 20 | FLOAT |
| ERASE | 0 | 25 | 25 | 0 | 5 |
| $\overline{ERASE}$ | 25 | 0 | 25 | 0 | 5 |
| $\overline{ERASE}$ | 25 | 0 | 0 | 0 | 0* |
| $\overline{ERASE}$ | 0 | 25 | 0 | 0 | 0* |

*ERASE LIMIT

SELF-LIMITING ERASABLE MEMORY CELL WITH TRIPLE LEVEL POLYSILICON

BACKGROUND OF THE INVENTION

This invention relates to semiconductor memory devices, and more particularly to a non-volatile electrically erasable MOS memory of the floating gate type.

Electrically erasable floating gate memory devices are shown in U.S. Pat. No. 4,122,509 issued to L. S. Wall and U.S. Pat. No. 4,122,544 issued to D. S. McElroy, assigned to Texas Instruments, and in U.S. Pat. No. 3,984,822 issued to Simko et al. These devices allow electrical erasure by discharge of the floating gate through the oxide layer between the floating gate and the control gate, with proper voltages on the source, drain and control gate. One of the initial problems with these devices was overerasure, which caused the channel beneath the floating gate to go into the depletion mode so the memory transistor would conduct even with zero volts on the control gate. The structure of the McElroy patent sought to correct this problem by adding a series enhancement transistor. Even this device still exhibited problems in some conditions. First, erasure was a competing mechanism during programming because the high positive voltage in the control gate, about +25 v, plus the negative charge on the floating gate, result in fields very close to those of erase under 30 to 35 v bias. Although the ratio of the capacitance of the floating gate to control gate to the capacitance of the floating gate to the substrate could be adjusted, improving programming would degrade erase and vice versa. The result was that the programming level attained was limited by the erase mechanism, and the programming time was lengthened somewhat. A second problem was that for a very good erase mechanism, a read disturb condition was a possibility, i.e., there would be loss of electrons from a programmed floating gate, especially at higher operating voltages, for example +10 v. Third, programming difficulty occured when the floating gate was overerased too far. This occured for two reasons. One, the effective gate voltage over the floating gate channel was higher and if it got too high for a given drain voltage the programming dropped. Two, the effective drain to source voltage decreased because the floating gate channel conductance was higher compared to the series enhancement device; this too would decrease programming.

It is therefore the principal object of this invention to provide an improved electrically erasable floating gate MOS memory device. Another object is to provide a floating gate EAROM which avoids overerasure problems. A further object is to provide an EAROM cell with self-limiting erase and small cell size.

SUMMARY OF THE INVENTION

In accordance with one embodiment of the invention, a non-volatile semiconductor memory device of the electrically erasable type employs a floating gate which is programmed by application to high voltage across the source and drain so that hot electrons traverse the gate oxide. The floating gate is discharged by electron tunneling through an erase window which is separated from the control gate. Very small cell size is provided by a triple level polysilicon structure.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 4a is a schematic diagram of four of the cells in an array showing various conditions from FIG. 4.

DETAILED DESCRIPTION OF SPECIFIC EMBODIMENT

Figure 1:
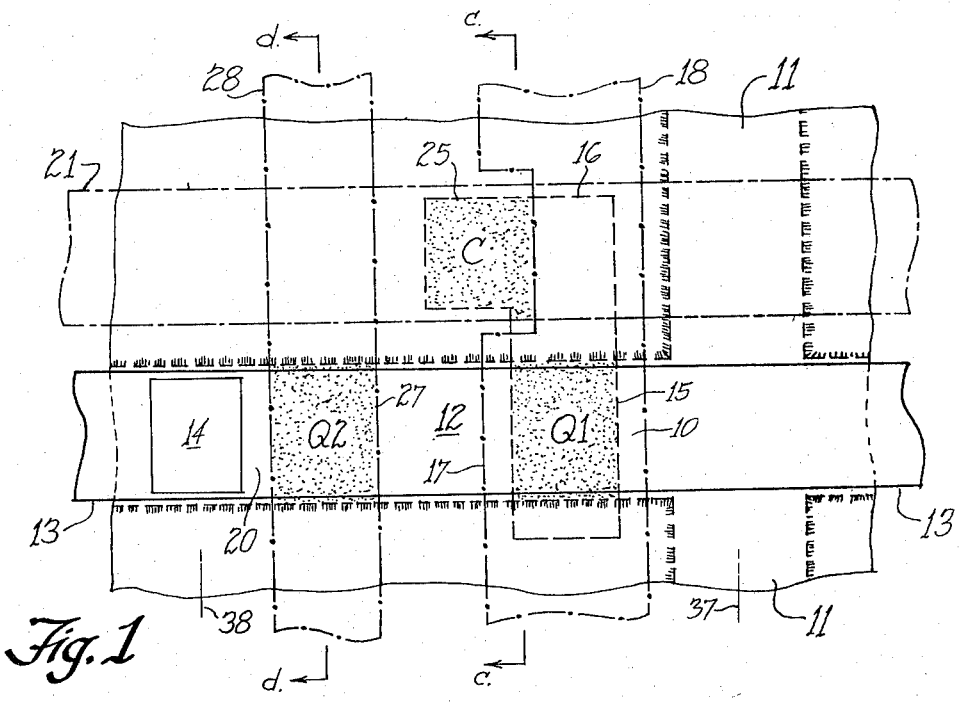
FIG. 1 is a greatly enlarged plan view of a small portion of a semiconductor chip showing the physical layout of one cell of an EAROM array made according to the invention.
Figure 2:
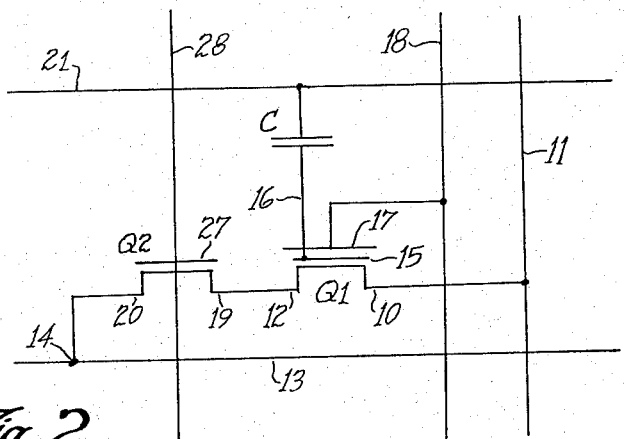
FIG. 2 is an electrical schematic diagram of the EAROM of FIG. 1.
Figure 3A:
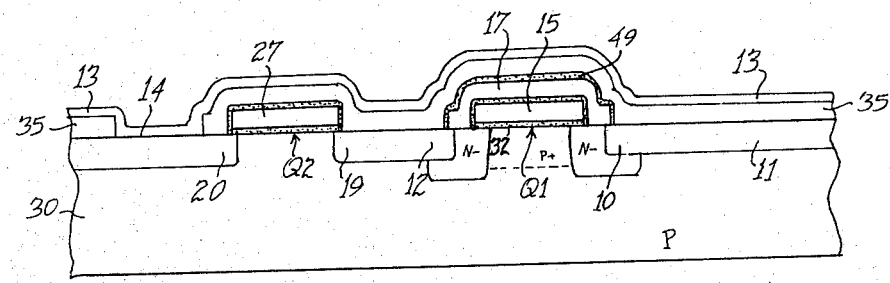
FIGS. 3a-3d are elevation views in section of the cell of FIG. 1, taken along the lines a—a, b—b, c—c, and d—d, respectively.
Figure 3B:
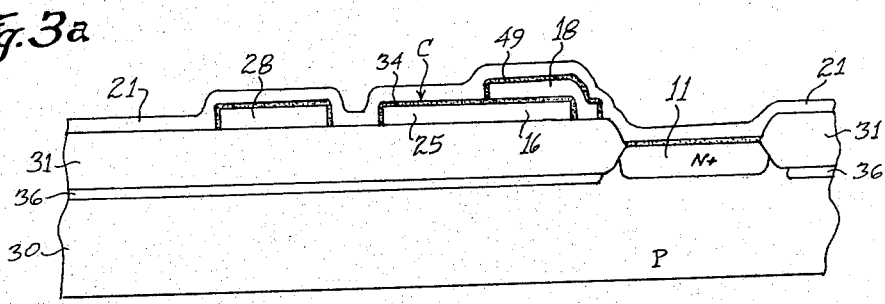
Figure 3C:
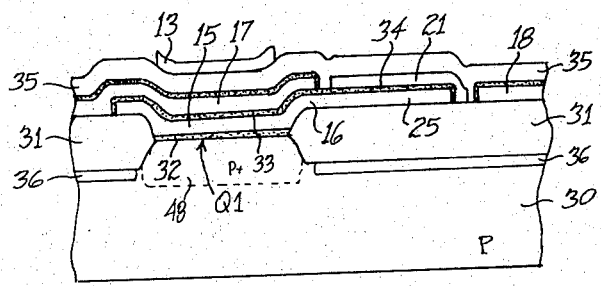
Figure 3D:
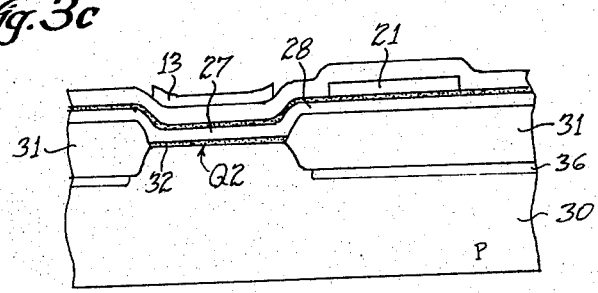

With reference to FIG. 1, a layout of an electrically erasable memory cell in semiconductor integrated circuit form is shown greatly enlarged. The same cell is shown in schematic diagram form in FIG. 2 where the same reference numerals are used for the same elements and the physical positions are generally the same. The cell consists of a memory transistor Q1 which has a source region 10 connected to a common source line 11 and a drain 12 connected through a series enhancement transistor Q2 to a column address line 13 at a metal-to-moat contact 14. The transistor Q1 has a floating gate 15 which is part of a first level polysilicon segment 16, and has a control gate 17 which is part of a second level polysilicon strip 18 functioning as a row address line for an array of the cells. The enhancement mode transistor Q2, functioning as part of an over-erase prevention device, has a source 19 which is also part of the drain 12 and a drain 20 which is connected to the metal strip 13 at the metal-to-moat contact 14. A third level polysilicon strip 21 includes an erase window C which is an area of the third level poly strip 21 coupled to an area 25 of the first level poly segment 16 through thin oxide. The over-erase prevention transistor Q2 has a control gate 27 which is part of another second level polysilicon address line 28.

In FIGS. 3a-3d the physical structure of the cell of FIG. 1 is seen in more detail in a series of sectional views. The cell is formed in one face of a silicon semiconductor wafer or chip 30 which is predominately P-type. The common source region 11, the sources 10 and 19, and the drains 12 and 20 are formed by N+ diffused regions in "moat" areas in the face. The moat areas are depressed below the surface of thick field oxide 31 which covers all of the face except where moats exist. The first level polycrystalline silicon floating gate 15 is separated from the silicon surface by a thin gate oxide layer 32, and the control gate 17 is separated from the floating gate by a thin dielectric coating 33 which is SiO$_2$, silicon nitride, or a combination. A silicon oxide coating 34, different from the coating 33, separates the first level poly area 25 and the third level poly strip 21 at the erase window C. An aluminum strip forming the column address line 13 is separated from the second level poly by a thick low-temperature deposited oxide coating 35. Beneath the field oxide layer 31 are P+ channel stop regions 36 as is standard practice in N-channel silicon gate integrated circuits.

The cell shown usually would be part of an array of perhaps 16K or 16,384 cells in a single silicon chip, arranged in 128 rows and 128 columns of cells. Thus 128 of the row address lines 18 would be included, along with 128 of the column address lines 13. To conserve space, the common source line 11 would be shared with the row of cells to the right of the cell shown in FIG. 1, so the cell would be mirrored about an axis 37. Likewise, the cell to the left of the one shown would share the contact 14, the cell being mirrored about an axis 38. A cell size of less than about one square mil is obtained, so an array of 16K cells would occupy less than about 16,000 sq. mils on a chip, or about one-eighth inch on a side.

In operation, the memory cell Q1 functions as one bit of memory by storing a logic "1" or "0" depending upon whether the floating gate 15 is charged with electrons or discharged. When the row address lines 18 and 28 are actuated or at logic 1 for this particular row (all other rows being at logic 0 or Vss), the transistor Q1 will turn on and be conductive from source 10 to drain 12 if the floating gate 15 is discharged, but will not turn on if the floating gate is charged negative because this will repel electrons from the channel region and effectively raise the threshold voltage of the transistor Q1. The transistor Q2 will be conductive because its gate is high. Thus, the column line 13, which is coupled to the output of the chip through a Y decoder when this particular cell is addressed, will discharge through the transistors Q2 and Q1 to the grounded common source line 11 when the floating gate is discharged, but will not discharge if the floating gate is charged. To program or write into the cell, the row address lines 18 and 28 are held at about +25 volts, the column address line 13 is at Vss, and the common source line 11 is brought up to a program voltage of about +20 V, much greater than logic 1 voltage. This causes high current from source to drain and electrons traverse the thin gate oxide 32 to the floating gate 15 where they are trapped. The leakage from the floating gate is very small so the device will stay programmed for many years.

According to the invention, electrical erase is provided by the erase window C and the erase bus line 21. Electrical erase can only occur through the erase window C, not between the floating gate 15 and the control gate 17 because the interlevel oxide 34 is processed differently than the oxide 33. The overlap capacitance of the erase window C is made small compared to the capacitance to the control gate 17 so that the floating gate 15 is much more strongly coupled to the control gate than to the erase line 21. Erase is performed by bringing the erase line 21 high, to about +25 V, while connecting the row address line 28 to +25 V also, the column address line 13 to a logic 1 voltage of +5 V, and the common source line 11 and address line 18 to ground or Vss. Since coupling to the control gate and substrate far outweighs that to the erase line the floating gate 15 will not move away from its original potential very much; if it has been programmed to a Vt of about +10 V it will not shift more than one volt or to a Vt of about +9 V due to capacitive coupling when the erase line goes high. Thus a large built in field of about 25 volts per 1000 Angstroms will be impressed across the interlevel oxide 34, and electrons will traverse this oxide.

Figures 4, 5:
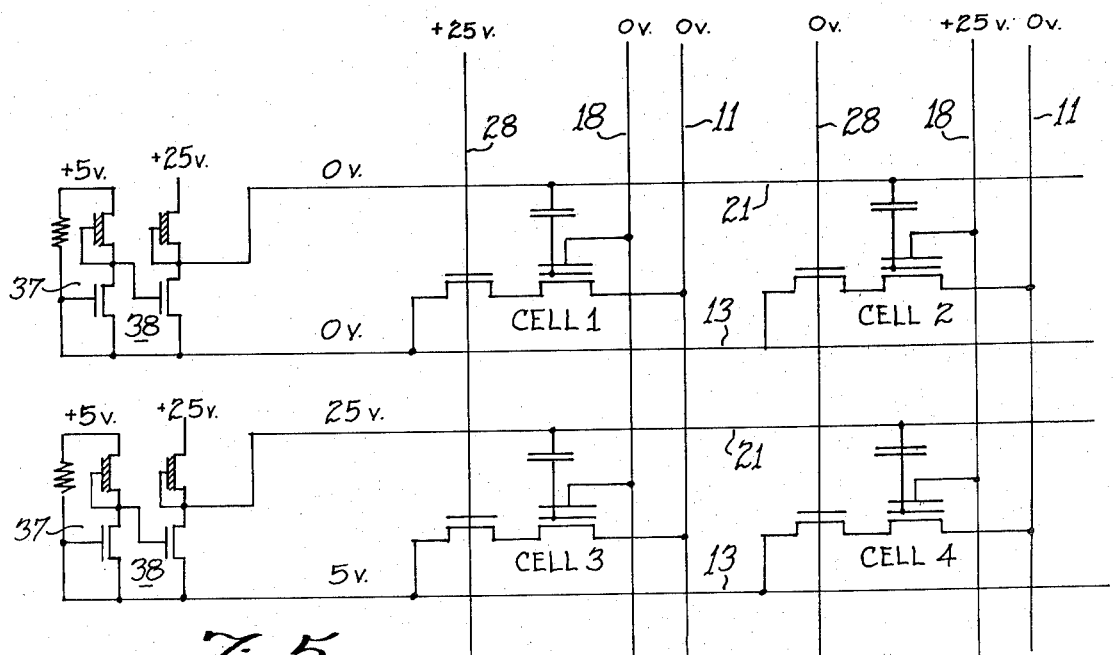
FIG. 4 is a table of voltages on the electrodes of the cell of FIG. 1 for various operating conditions.

A Table of the cell states under various conditions is shown in FIG. 4. The "erase limit" or E.L. state is generated in a circuit as seen in FIG. 4a. The four cells shown with the voltages indicated illustrate the erase state and all three erase inhibit states.

Cell 1 is in an erase inhibit state and has +25 V on the address line 28 but Vss on the lines 11, 13, 18 and 21. This state occurs when the cell is sufficiently erased to conduct even with OV on the address line 18. The transistor Q1 may go to a slightly depletion mode condition for this to happen, i.e., a positive charge on the floating gate 15, but with the series enhancement transistors Q2 controlled by the address line 28 this will not present a problem during a read operation. Once conduction occurs the line 13 is pulled to ground forcing the line 21 to ground through the two inverter stages 37 and 38, or by similar means.

Cell 2 is in an erase inhibit state with the address line 18 at +25 V and the lines 11, 13, 21 and 28 at OV. The cell will not erase because the erase line 21 is forced low by the inverter stages 37 and 38 as before and the interlevel oxide 33 between the floating gate 15 and control gate 17 is processed to prevent electrical erase. The address line 28 being at OV prevents conduction of cell 2 because the transistor Q2 is nonconductive, regardless of the state of the floating gate transistor Q1.

Cell 3 is in the erase state with +25 V on lines 21 and 28, lines 11 and 18 grounded, and +5 on line 13. This state erases because the floating gate 15 has been programmed to a charged state so the transistor Q1 is nonconducting when the line 18 is at zero. The capacitance ratio is tailored as explained such that coupling of the floating gate 15 to the control gate 27 is much larger than to the erase window C. This guarantees that the bulk of the voltage applied to the line 21 is dropped across the segment 16 to line 21 capacitance and little voltage drop across the segment 16 to substrate capacitance.

Cell 4 is in an erase inhibit state with +25 V on lines 18 and 21, +5 on line 13, and lines 11 and 28 grounded. This is the condition of unaddressed cells on an erase line. Erase inhibition comes about because the address line 18 is biased high, coupling the floating gate 15 to a high positive voltage. This results in a relatively small drop across the capacitance of the segment 16 to line 21 erase window, and hence negligible or no disturb to the state. Here again the series enhancement transistor Q2 will not conduct because the line 28 is at zero, regardless of the charge or discharge state of the floating gate 15 in the memory transistor Q1.

It is important to note that the series enhancement transistor Q2 has two functions. First, it prevents conduction during read operations for unaddressed cells which have gone into the depletion mode. Second, it prevents conduction of cells which do not get erased, thereby allowing the state of a cell on a particular erase line 21 to be monitored by the stages 37, 38; therefore bulk erase cannot be implemented while simultaneously using the self-limiting erase.

Turning now to FIGS. 5a-5e and 6a-6e, a process for manufacturing the devices described above will be explained. Note that FIGS. 5a-5e correspond to the sectional view of FIG. 3a in the finished device, that is to line a—a in FIG. 1, while FIGS. 6a–6e correspond to the sectional view of FIG. 3b, that is to the line b—b in FIG. 1.

This is basically an N-channel, silicon-gate, self-aligned, triple level poly process for making MOS integrated circuit devices. The starting material is a slice of P-type monocrystalline semiconductor grade silicon, perhaps 3 inches in diameter, cut on the <100> plane, doped with boron in growing to a resistivity of about 6 to 8 ohm-cm. In the FIGURES the portions shown are only about one or two mils wide and represent very small parts of the slice, chosen as representative sample cross sections. First, after appropriate cleaning, the slice is oxidized by exposing to oxygen in a furnace at an elevated temperature of perhaps 1000 or 1100 Degrees C. to produce an oxide layer 41 of a thickness of about 1000 Angstroms. Next, a layer 42 of silicon nitride $Si_3N_4$ of about 1000 Angstroms thickness is formed by exposing to an atmosphere of dichloro-silane and ammonia in a reactor. A coating of photoresist is applied to the entire top surface, then exposed to ultraviolet light through a mask which defines the desired pattern, and developed. This leaves areas 44 where nitride is etched away using a plasma etch; these are the areas where field oxide 31 is to be grown. Another coating of photoresist may be applied and patterned to cover areas wider than which will be the moats. The purpose of this oversized moat mask is to prevent channel stop P+ regions 36 from being in contact with N+ regions because lower breakdown would result at P+ to N+ junctions. High voltages are used in programming, compared to usual N-channel devices.

The slice is now subjected to an ion implant step, preferably using this oversized moat mask, whereby boron atoms are implanted in the areas of silicon not covered by photoresist which masks the implant. Boron is an impurity which produces P-type conductivity, so more heavily doped P+ regions 46 will be produced in the surface. The oxide layer 41 is left in place during the implant because it prevents the implanted boron atoms from out-diffusing from the surface during subsequent heat treatment. The boron implant is at a dosage of about $4 \times 10^{13}/cm^2$ at 100 KeV. After the implant, the photoresist layers are removed.

As will be seen, the regions 46 do not exist in the same form in the finished device, because some of this part of the slice will have been consumed in the oxidation procedure. The implanted regions 46 will ultimately produce the P+ channel stop regions. Because of the oversized moat mask, the channel stop regions do not touch the channels or N+ regions.

Figures 5A, 6A:
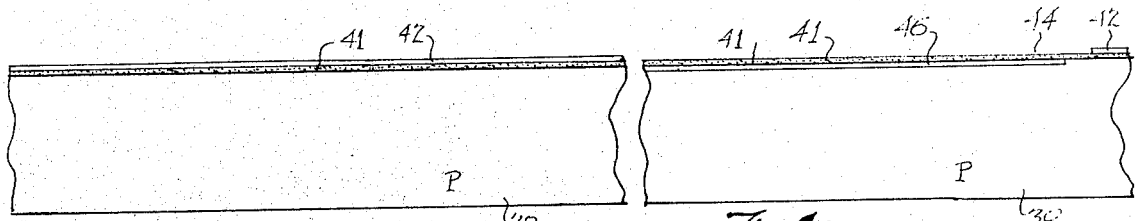
FIGS. 5a-5e and 6a-6e are elevation views in section of the EAROM semiconductor device of FIGS. 1 and 3a-3d, at successive stages in the manufacturing process, taken generally along the lines a—a and b—b in FIG. 1.
Figures 5B, 6B:
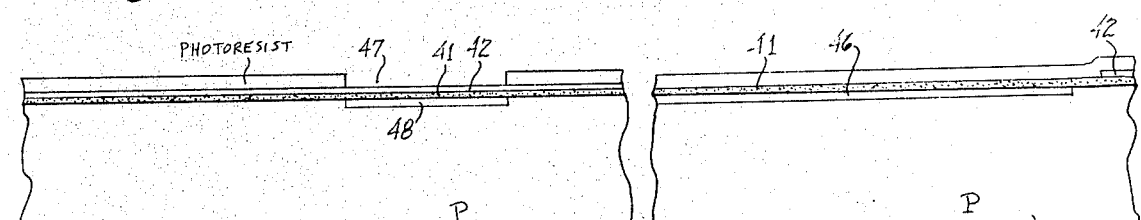

Turning now to FIGS. 5b and 6b, the P+ tank implant step is illustrated. A coating of photoresist is applied, then patterned to expose only areas 47 in the cell array which are about the width of the second level poly. Then the slice is subjected to a boron implant step at a dosage of perhaps $7 \times 10^{12}$ at 100 KeV to produce implanted regions 48.

As set forth in U.S. Pat. No. 4,055,444 issued to G. R. Mohan Rao, assigned to Texas Instruments, the next step in the process is to subject the slice to a heat treatment or anneal step, during which the slice is maintained at a temperature of about 1000 Degrees C. for perhaps approximately 2 hours in an inert atmosphere, preferably nitrogen. This step causes the implanted boron concentration to change and reduces bulk damage in the crystal structure caused by the implant. The implanted P+ regions will have penetrated deeper into the silicon surface after the anneal step.

Figures 5C, 6C:
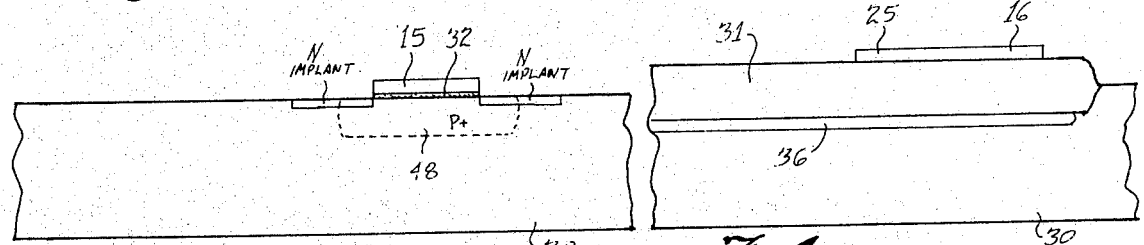

The following step in the process is formation of field oxide, which is done by subjecting the slices to steam or an oxidizing atmosphere at over 900 Degrees C. for several hours. As seen in FIGS. 5c and 6c, this causes a thick field oxide layer 31 to be grown, and this layer extends into the silicon surface because silicon is consumed as it oxidizes. The nitride layer 42 masks oxidation beneath it. The thickness of this layer 31 is about 8000 to 10,000 Angstroms, half of which is above the original surface and half below. The boron doped P+ regions 46 as previously implanted and modified by the anneal step, will be partly consumed, but boron will also diffuse further into the silicon ahead of the oxidation front. Thus, P+ channel stop regions 36 will result which will be deeper and of more uniform and acceptable concentration at the surface compared to what would have resulted without the anneal step. Also, the regions 36 will not have the extent of crystalline structure damage characteristic of implanted devices.

The nitride layer 42 and its underlying oxide layer 41 are removed by etching, as the next step, and another thin silicon oxide layer 32 of about 800 Angstroms is grown over the exposed areas of silicon. Windows for first level polysilicon to substrate contacts (none seen in these views) are patterned and etched using photoresist, removing the gate oxide layer 32 in selected areas. An implant to adjust the threshold of selected transistors may be performed at this point. Next, a first layer of polycrystalline silicon is deposited over the entire slice in a reactor using standard techniques, for example for decomposition of silane in hydrogen at about 930 Degrees C. to a thickness of about 6000 Angstroms, producing the polysilicon which will ultimately form the segment 16 including the floating gate 15 and the part 25.

The first level polysilicon coating is next patterned by applying a layer of photoresist, exposing to ultraviolet light through a mask prepared for this purpose, developing, then etching with the remaining photoresist masking certain areas of the polysilicon. The slice is next subjected to a phosphorus or arsenic implant which will create the lightly doped implanted source and drain N-regions using a photoresist mask to block off the implant outside of Q1.

Figures 5D, 6D:
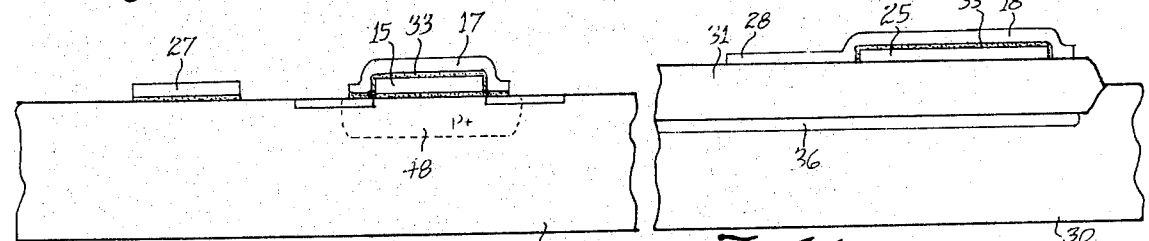

The layer 33 of silicon dioxide is next grown on the polysilicon, producing a coating on all exposed surfaces of the poly, as seen in FIGS. 5d and 6d, including tops and sides. The layer 33 is grown at about 1100° C. in dry oxygen for about ½ hour, (or at 900° C. in steam, or a composite $SiO_2/Si_3N_4$ dual layer is formed), producing perhaps 1000 Å thickness and consuming part of the polysilicon. This layer 33 will not permit electrons to traverse so little or no erase will occur from first to second level poly.

Figures 5E, 6E:
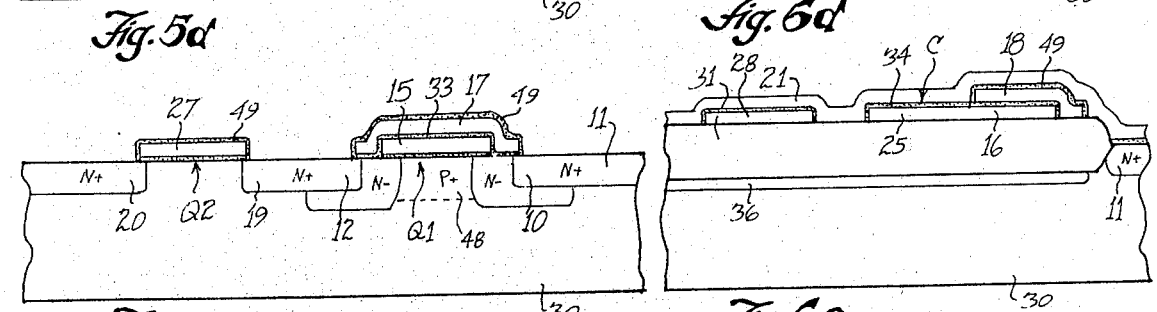

The second level polysilicon is next deposited over the entire top surface of the slice over the oxide layer 33, using a reaction as above, to provide the control gates 17 and 27 and the strips 18 and 28. The second level poly is patterned using photoresist to define the strips 18 and 28, and the thin oxide layers 33, etc. are etched away in all areas except under the polysilicon strips. As seen in FIGS. 5e and 6e, a deposition and diffusion operation now produces the heavily doped N+ source and drain regions 10, 12, 19, 20 as well as the region 11 in the moat and the N+ region under the contact area 14. The depth of diffusion is about 8000 to 10,000 Angstroms. The N+ diffused regions function as conductors which connect the various regions together, and also function as the source or drain regions. This diffusion also heavily dopes all the exposed second level polysilicon areas.

A layer 49 of oxide is produced over the second level poly by thermal oxidation just as the layer 33 was produced. Then, using a photoresist mask to expose only the erase window C at the part 25, the oxide 49 and the second level poly and oxide 33 are etched away at this point only to leave bare the first level poly again. The layer 34 of silicon oxide is grown by thermal oxidation as before, but this layer is processed to enhance the erase mechanism by allowing electrons to penetrate. This is accomplished by making the oxide layer 34 thinner than layers 33 or 49, growing in dry O2 at 900° C. Third level doped poly strip 21 is next deposited and patterned.

Fabrication of the device is continued by depositing a layer 35 of glaze or phosphorus-doped oxide. Rather than by oxidizing, this is done by a low temperature reaction process using conventional chemical vapor deposition techniques. A layer of about 10,000 Å is produced, covering the entire slice. This deposition is followed by a "densification" step wherein the slice is heated at 1000° C. for the purpose of eliminating minute holes or pores in the oxide. Subsequently, a photoresist operation opens a window in the oxide layer 35 in the areas 14 where contact is to be made from metal to moat. Then, a layer of aluminum is deposited on the entire slice, and etched using photoresist masking to provide the desired pattern of metal interconnections such as the strip 13.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An electrically erasable insulated gate field effect transistor memory device comprising source and drain regions defined in a face of a body of semiconductor material, a floating gate on said face between the source and drain regions insulated from the semiconductor material by a gate insulator, a control gate overlying part of the floating gate and insulated therefrom by an interlevel insulator, conductive means overlying said face and insulated therefrom by an insulating layer with a portion of the conductive means overlying a segment of the floating gate, said segment being laterally spaced on said face from said part and from the control gate, the conductive means partially overlying the control gate, an insulating coating on said segment separating the portion of the conductive means from said segment but permitting the floating gate to discharge electrons into the conductive means upon application of high voltage thereto.

2. A device according to claim 1 wherein said segment of the floating gate is separated from the remainder thereof by substantial lateral space.

3. A device according to claim 2 wherein said control gate is part of a first strip of polycrystalline silicon.

4. A device according to claim 3 wherein said conductive means includes a strip of polycrystalline silicon which crosses the first strip but is insulated therefrom.

5. A device according to claim 1 including an enhancement mode transistor having a source-to-drain path in series with the source and drain regions of said memory device, and wherein a control gate of the enhancement mode transistor is separate from the control gate and floating gate of the memory device.

6. A method of making an electrically erasable floating gate field effect transistor memory cell comprising the steps of:
depositing a first layer of conductive material on a face of a silicon body to provide a floating gate which is over a channel region of said face between source and drain areas of said field effect transistor, and to provide an erase window laterally spaced from said channel region,
depositing a second layer of conductive material on said face overlying said floating gate but insulated therefrom by a first insulator coating to provide a control gate, the control gate not overlying said erase window,
depositing a third layer of conductive material on said face partially overlying the second layer and overlying said erase window but insulated therefrom by a second insulator coating, the second insulator coating differing from the first insulator coating by enhanced erase current through the second insulator coating relative to that through the first insulator coating.

7. A method according to claim 6 wherein the step of depositing a first layer includes patterning said first layer to define a segment of first level conductive material containing said floating gate over the channel and said erase window at a position spaced away from the channel.

8. A method according to claim 7 wherein the steps of depositing the second and third layers include patterning the second level to define a first elongated strip including the control gate and patterning the third level to define a second elongated strip perpendicular to and crossing over said first elongated strip.

9. A method according to claim 8 wherein the step of depositing said second layer includes patterning the second layer to define a third elongated strip parallel to the first elongated strip to provide a gate of an enhancement mode transistor in series with said field effect transistor.

10. A method according to claim 9 wherein said third layer directly overlies the first layer only at said erase window.

11. A semiconductor device comprising first and second regions defined in a face of a body of semiconductor material, a first gate on said face between the first and second regions insulated from the semiconductor material by a gate insulator, a second gate overlying part of the first gate insulated therefrom by an interlevel insulator, a segment of the first gate laterally spaced from said second, conductive means on said face partially overlying said first gate and insulated therefrom by an insulating layer with a portion of the conductive means laterally spaced from said first gate overlying said segment of the first gate, an insulating coating on said segment separating the portion of the conductive means from said segment but permitting the first gate to discharge electrons into the conductive means.

12. A device according to claim 11 wherein said device is an insulated gate field effect transistor of the electrically programmable type.

13. A device according to claim 12 wherein said second gate is part of a strip of polycrystalline silicon and wherein said conductive means includes a second strip of polycrystalline silicon which crosses the first strip but is insulated therefrom.

14. A method of making a semiconductor device comprising the steps of:

depositing a first layer of conductive material on a face of a semiconductor body to provide a first gate which is over a channel region of said face between first and second regions of said device, and to provide a window area laterally spaced on said face from said channel region, depositing a second layer of conductive material on said face overlying said first gate but insulated therefrom by a first insulator coating to provide a second gate, depositing a third layer of conductive material on said face partially overlying said second layer and overlying said window area but insulated therefrom by a second insulator coating, the second insulator coating differing from the first insulator coating.

15. A method according to claim 14 wherein the steps of depositing the second and third layers include patterning the second level to define a first elongated strip including the second gate and patterning the third level to define a second elongated strip perpendicular to and crossing over said first elongated strip.

* * * * *